US006856377B2

(12) United States Patent
Suenaga

(10) Patent No.: US 6,856,377 B2
(45) Date of Patent: Feb. 15, 2005

(54) RELAY IMAGE OPTICAL SYSTEM, AND ILLUMINATING OPTICAL DEVICE AND EXPOSURE SYSTEM PROVIDED WITH THE OPTICAL SYSTEM

(75) Inventor: Yutaka Suenaga, Yokohama (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 10/344,107
(22) PCT Filed: Aug. 10, 2001
(86) PCT No.: PCT/JP01/06913
§ 371 (c)(1), (2), (4) Date: Aug. 1, 2003
(87) PCT Pub. No.: WO02/14924
PCT Pub. Date: Feb. 21, 2002

(65) Prior Publication Data
US 2004/0070742 A1 Apr. 15, 2004

(30) Foreign Application Priority Data
Aug. 11, 2000 (JP) ........................................ 2000-243546

(51) Int. Cl.$^7$ ............................................. G03B 27/54
(52) U.S. Cl. ........................... 355/67; 355/71; 359/649; 359/656; 359/725; 359/727
(58) Field of Search ............................. 355/53, 67, 71; 359/649, 656, 725, 727

(56) References Cited

U.S. PATENT DOCUMENTS

| 4,906,080 A | 3/1990 | Omata |
| 5,305,054 A | 4/1994 | Suzuki et al. |
| 5,631,721 A | 5/1997 | Stanton et al. |
| 5,982,558 A | 11/1999 | Furter et al. |
| 6,084,655 A | 7/2000 | Suzuki et al. |
| 6,128,068 A | 10/2000 | Suzuki et al. |
| 6,217,909 B1 | 4/2001 | Sherwood et al. |
| 6,295,122 B1 | 9/2001 | Schultz et al. |
| 6,366,410 B1 * | 4/2002 | Schultz et al. ............... 359/649 |
| 2001/0007495 A1 | 7/2001 | Suzuki et al. |
| 2001/0015797 A1 | 8/2001 | Suzuki et al. |

FOREIGN PATENT DOCUMENTS

| CA | 2 061 499 | 8/1992 |
| CA | 2 177 196 A1 | 11/1996 |
| DE | 195 48 805 A1 | 7/1997 |
| DE | 692 22 963 T2 | 3/1998 |
| DE | 198 09 395 A1 | 9/1999 |
| EP | 0 500 393 A2 | 8/1992 |
| EP | 0 744 664 A2 | 11/1996 |
| EP | 0 783 137 A2 | 7/1997 |
| EP | 0 940 722 A2 | 9/1999 |
| JP | A 62-266513 | 11/1987 |
| JP | A 4-329623 | 11/1992 |
| JP | A 9-7940 | 1/1997 |
| JP | A 9-82631 | 3/1997 |
| JP | A 9-197270 | 7/1997 |
| JP | A 11-329963 | 11/1999 |
| JP | A 2000-98226 | 4/2000 |
| KR | 96-6684 B1 | 5/1996 |
| KR | 96-6686 B1 | 5/1996 |
| KR | A 97-48690 | 7/1997 |
| KR | A 1999-0077424 | 10/1999 |
| TW | 409198 | 10/2000 |

\* cited by examiner

Primary Examiner—D. Rutledge
(74) Attorney, Agent, or Firm—Oliff & Berridge PLC

(57) ABSTRACT

This invention provides a relay imaging optical system which is composed of a small number of lenses and can be miniaturized and reduced in weight with maintaining required optical characteristics. This relay imaging optical system is provided for forming an image of a first plane (10) on a second plane (M), and comprises a first lens group G1 which is constructed so that an image plane thereof is positioned within a limited range, a second lens group G2, and a third lens group G3, from the first plane side. At least two lens groups of the first lens group through the third lens group have at least one aspheric surface respectively; and the total number of lenses which constitute this optical system are ten or fewer.

35 Claims, 9 Drawing Sheets

RELAY IMAGE OPTICAL SYSTEM, AND ILLUMINATING OPTICAL DEVICE AND EXPOSURE SYSTEM PROVIDED WITH THE OPTICAL SYSTEM

TECHNICAL FIELD

The present invention relates to a relay imaging optical system, and to an illumination optical apparatus and an exposure apparatus having this relay imaging optical system. More specifically, the present invention relates to a relay imaging optical system appropriately used for an illumination optical apparatus of an exposure apparatus for manufacturing micro-devices such as semiconductor elements, imaging elements, liquid crystal display elements, and thin film magnetic heads by a photolithography process.

BACKGROUND ART

In a typical exposure apparatus of this type, a light beam emitted from a light source is entered into an optical integrator such as a fly-eye lens, and then forms a secondary light source which is composed of a plurality of light sources on a rear focal point of the optical integrator. The light beam from the secondary light source is condensed by a condenser lens and forms an illumination field on a predetermined position which conjugates with a mask. A mask blind which functions as an illumination field stop is provided in the vicinity of the illumination field.

The light beam from the illumination field on the predetermined position is restricted by the illumination field stop and illuminates the mask in which a predetermined pattern is formed thereon by superimposing the light onto the mask through a relay imaging optical system. As a result, an image of an opening portion of the illumination field stop is formed on the mask as an illumination area. The light which passes through the pattern of the mask is imaged onto a photosensitive substance through a projection optical system. Consequently, projection exposure (transference) of the pattern of the mask onto the photosensitive substance is performed.

In the above typical exposure apparatus, in order that the effects of gravity on the mask and photosensitive substance act symmetrically around an optical axis of the projection optical system toward the mask and photosensitive substrate, a structure is commonly employed in which the optical axis of the projection optical system is made to coincide with the direction of gravity (vertical direction) and the mask and the photosensitive substrate are held in horizontal direction. In this structure, the relay imaging optical system which optically conjugates the illumination field stop and mask is provided on the top portion of the exposure apparatus. Therefore, it is preferable that the relay imaging optical system be miniaturized and reduced in weight in order to obtain the exposure system having a structure which is resistant to the effects of vibration. In other words, it is preferable that the relay imaging optical system be composed of a small number of lenses.

Furthermore, in recent years, an exposure light tends to have a short wavelength in accordance with the development of miniaturization of the patterns to be transferred, and a KrF excimer laser having wavelength of 248 nm or an ArF excimer laser having a wavelength of 193 nm is now being used as the light source of the exposure light. In this case, phenomena that surfaces of the lenses may easily be clouded and permeability of the lenses may easily be decreased due to detrimental gases are known. Therefore, the relay imaging optical system which is composed of a small number of lenses is advantageous to avoid these phenomena.

The present invention was provided in consideration with the foregoing problems, and one object of the invention is to provide a relay imaging optical system which is composed of a small number of lenses and can be miniaturized and reduced in weight with maintaining required optical characteristics. Furthermore, the other object of the invention is to provide an illumination optical apparatus and an exposure apparatus having a relay imaging optical system which is composed of a small number of lenses and is miniaturized and reduced in weight.

DISCLOSURE OF INVENTION

In order to solve the above problems, the first invention of the present invention provides a relay imaging optical system which forms an image of a first plane on a second plane, and characterized in that: imaging magnifications of the optical system are three or fewer, the total number of lenses which constitute the optical system are ten or fewer, and the optical system has at least two aspheric surfaces and one of the aspheric surfaces is located in the vicinity of the first plane or in the vicinity of the second plane.

In the first invention, it is preferable that the above optical system comprises a first lens group, a second lens group, and a third lens group, from the first plane side; and each of the first lens group and third lens group has at least one aspheric surface. Furthermore, it is preferable that the second lens group has at least one aspheric surface.

Furthermore, in the first invention, it is preferable that the first lens group has a meniscus lens L1 in which a concave surface thereof faces the first plane side and at least two positive lenses, and each of the second lens group and third lens group has at least one positive lens.

In this case, it is preferable that a conditional expression $$0.1 < |f1/R1| < 10$$

be satisfied when radius of curvature of the concave surface of the meniscus lens L1 which faces the first plane side is designated as R1, and focal length of the above first lens group G1 is designated as f1.

The second invention of the present invention provides a relay imaging optical system which forms an image of a first plane on a second plane, and characterized in that: the optical system comprises a first lens group which is constructed so that an image plane thereof is positioned within a limited range, a second lens group, and a third lens group, from the first plane side; at least two lens groups of the first lens group through the third lens group have at least one aspheric surface respectively; and the total number of lenses which constitute the optical system are ten or fewer.

In the second invention, it is preferable that an aperture stop which intercepts unnecessary light be provided in the vicinity of the second lens group. Furthermore, it is preferable that magnifications of the second lens group range from $\frac{1}{100}$ to 100. In addition, it is preferable that the second lens group has at least one aspheric surface.

The third invention of the present invention provides a relay imaging optical system which forms an image of a first plane on a second plane, and is characterized in that: the optical system comprises a first lens group, a second lens group which substantially magnify, and a third lens group, from the first plane side; at least two lens groups of the first lens group through the third lens group have at least one aspheric surface respectively; and the total number of lenses which constitute the optical system are ten or fewer.

In the third invention, it is preferable that magnifications of the second lens group range from 1/100 to 100. Furthermore, it is preferable that each of the first lens group and third lens group has at least one aspheric surface. In addition, it is preferable that the second lens group has at least one aspheric surface.

The fourth invention of the present invention provides an illumination optical apparatus which illuminates an irradiated plane, and is characterized by comprising: a light source which emits light, an illumination field forming member which forms an illumination field on a predetermined plane based on the light beam emitted from the light source, and a relay imaging optical system according to the above described first through fourth inventions which forms an image of the illumination field which is formed on a first plane as the predetermined plane onto a second plane as the irradiated plane.

In the fourth invention, it is preferable that a field stop which changes an illumination area of the irradiated plane be formed on the predetermined plane.

The fifth invention of the present invention provides an exposure apparatus which is characterized by comprising: an illumination optical apparatus according to the above described fourth invention, and a projection optical system which performs projection exposing of a pattern of a mask which is provided on the above described irradiated plane onto a photosensitive substrate.

The sixth invention of the present invention provides a manufacturing method for micro-devices which is characterized by comprising: an exposure step for exposing a pattern of a mask onto a photosensitive substrate by using the exposure apparatus according to the above described fifth invention, and a development step for developing the photosensitive substrate which was exposed in the exposure step.

BEST MODE FOR CARRYING OUT THE INVENTION

Figure 1:
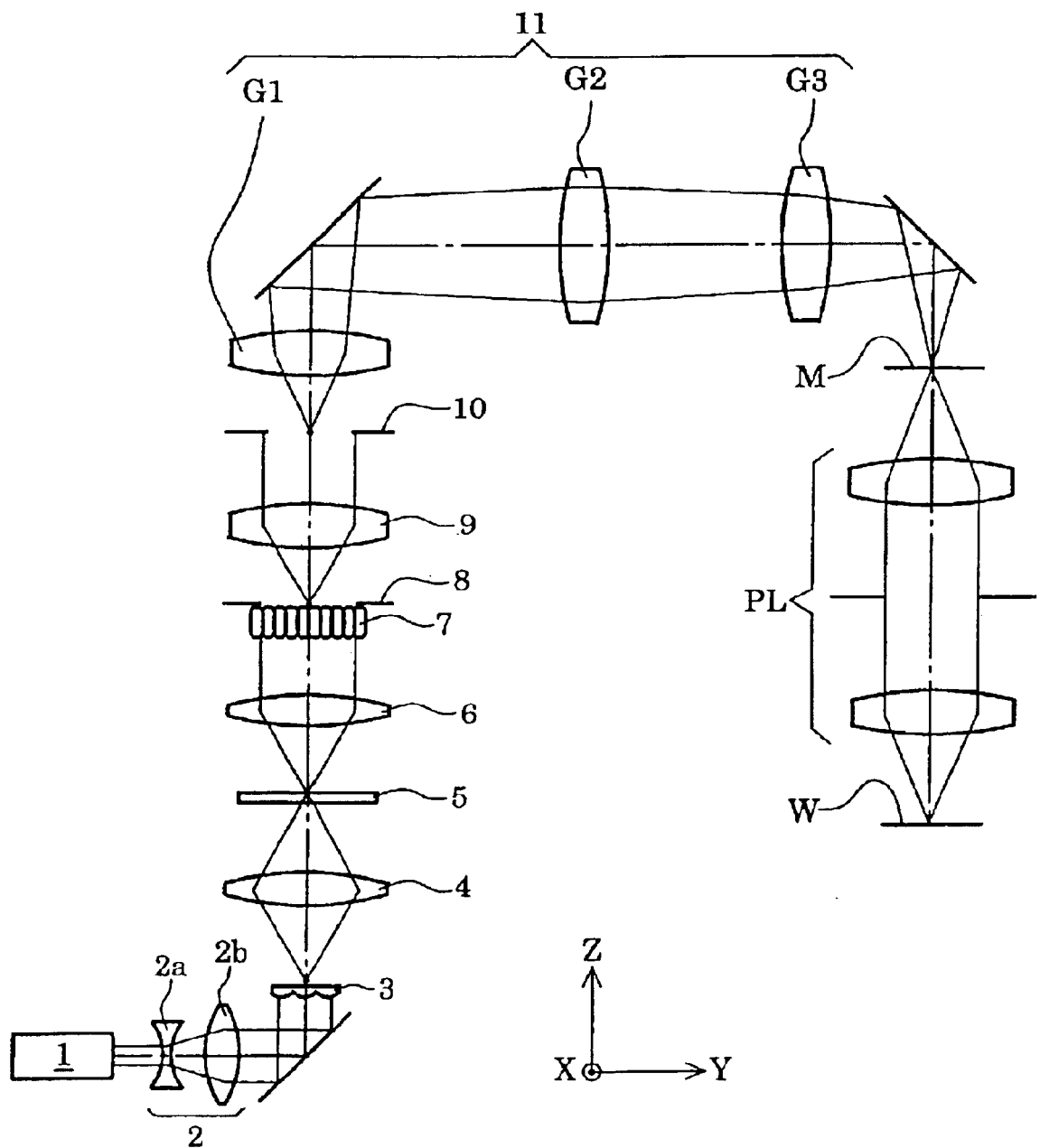
FIG. 1 is a diagram showing a schematic structure of an exposure apparatus concerning the present invention.

In general, some spherical aberration of a pupil remains in a refracting type projection optical system of an exposure apparatus. In this case, since a pattern image of a mask is not telecentrically projected on a photosensitive substrate, distortion is produced by slight defocus (positional aberration between an image plane of the projection optical system and the photosensitive substrate). Therefore, in a relay imaging optical system which optically and conjugately links an illumination field stop and the mask in an illumination system of the exposure apparatus, it is necessary to compensate (correct) the spherical aberration of the pupil in the projection optical system.

Accordingly, the present invention employs the relay imaging optical system in which their imaging magnifications are three or fewer for example; and having a structure in which at least two aspheric surfaces are introduced, and one of the aspheric surfaces is located in the vicinity of an object surface (a surface of the illumination field stop in the case of the exposure apparatus) or in the vicinity of an image surface (a patterning surface of the mask in the case of the exposure apparatus). When the relay imaging optical system is composed of first, second, and third lens groups, the spherical aberration of the pupil of the projection optical system can be compensated without strain by employing the aspheric surfaces in the first lens group which are located in the vicinity of the object surface or in the third lens group which is located in the vicinity of the image surface although the total number of lenses which constitute the system are ten or fewer, and the system has a simple structure. Furthermore, since the imaging magnifications of the relay imaging optical system are three or fewer, the spherical aberration of the projection optical system itself can be decreased, and therefore, the number of lenses can easily be decreased much more.

In this case, by employing the aspheric surfaces in the first lens group and in the third lens group respectively, the spherical aberration of the pupil of the projection optical system can be decreased much more easily without strain by means of much simple structure. Furthermore, in a typical embodiment of the present invention, the first lens group is constructed so that an image plane thereof is positioned within a limited range. In addition, the second lens group is constructed so as to have substantial magnifications, and to have magnifications ranging from 1/100 to 100, for example. Since the image plane of the first lens group is positioned within the limited range and the second lens group is substantially magnifying, degree of freedom of design of the system is enlarged and the number of lenses can easily be decreased, and maximum diameter of the lenses can be decreased.

Furthermore, in the present invention, the spherical aberration as an imaging characteristic of the optical system can be amended satisfyingly by employing the aspheric surfaces in the second lens group. In addition, occurrence of flaring and the like can be avoided by providing an aperture stop which intercepts unnecessary light in the vicinity of the second lens group. Here, in the typical embodiment of the present invention, the first lens group has a meniscus lens L1 in which a concave surface thereof faces the object side and at least two positive lenses, and each of the second lens group and third lens group has at least one positive lens.

In this case, it is preferable that the following conditional expression (1) be satisfied for promoting the compensation of the spherical aberration of the pupil of the projection optical system and for decreasing the Petzval's sum.

$$0.1 < |f1/R1| < 10 \tag{1}$$

Here, R1 denotes radius of curvature of the concave surface of the meniscus lens L1 which faces the first plane side, and f1 denotes focal length of the above first lens group G1.

In an area which is greater than an upper limit of the conditional expression (1), it is undesirable since a positive high-ordered spherical aberration is enlarged and cannot be amended. In contrast, in an area which is smaller than a lower limit of the conditional expression (1), it is undesirable since the Petzval's sum is increased and bluring of an image of the object (an image of an opening of the illumination field stop) which is formed on the image surface (a mask surface) is enlarged. Moreover, it is further undesirable since the compensation of the spherical aberration of the pupil of the projection optical system becomes difficult, and as a result, the number of lenses are increased.

As described above, in the relay imaging optical system of the present invention, the system can be miniaturized and reduced in weight while maintaining required optical characteristics by constructing the system with a smaller number of lenses. Therefore, in an illumination optical apparatus and the exposure apparatus having the relay imaging optical system of the present invention, effects of clouding on the surfaces of the lenses and of decrease of permeability of the lenses due to harmful gases are reduced even when an ArF excimer laser is used as a light source.

Furthermore, in the exposure apparatus having the relay imaging optical system of the present invention, the structure of the exposure apparatus becomes resistant to the effects of vibration as a result of the miniaturization and reduction in weight of the relay imaging optical system. Therefore, superior micro-devices can be manufactured with high accuracy by performing projection exposure using the exposure apparatus of the present invention under appropriate exposure conditions.

Next, embodiments of the present invention will be explained with reference to the drawings.

FIG. 1 is a diagram showing a schematic structure of an exposure apparatus concerning an embodiment of the present invention. In FIG. 1, a Z-axis is determined so as to extend along a normal line of a wafer W which is used as a photosensitive substrate, a Y-axis is determined so as to be parallel to the page of FIG. 1 on a surface of the wafer, and the X-axis is determined so as to be perpendicular to the page of FIG. 1 on the surface of the wafer. The exposure apparatus shown in FIG. 1 comprises an excimer laser light source which provides a light having a wavelength of 248 nm (KrF) or a light having a wavelength of 193 nm (ArF) as a light source 1 for supplying an exposure light (illumination light).

A roughly parallel light beam emitted from the light source 1 along the Y-direction has a rectangular cross section which is extended along the X-direction. The light beam enters into a beam expander 2 which is composed of a pair of lenses 2a and 2b. In FIG. 1, each of the lenses 2a and 2b has a negative refractive index or a positive refractive index, and at least one of the pair of lenses 2a and 2b is movably constructed along an optical axis AX. The light beam which has entered into the beam expander 2 is enlarged according to a space between the pair of lenses 2a and 2b in the page of FIG. 1 and shaped to the light beam which has a desired rectangular cross section.

The roughly parallel light beam which passed through the beam expander 2 which acts as a shaping optical system is deflected by a bending mirror, and then enters into a micro fly-eye 3. The micro fly-eye 3 is an optical element which is composed of a large number of regular hexagonal minute lenses which have positive refractive power and are closely arranged along crosswise directions. In general, each minute lenses which constitutes the micro fly-eye is smaller than each lens element which constitutes a fly-eye lens.

Furthermore, in the micro fly-eye, a large number of minute lenses are unitarily formed without being isolated, different from the fly eye lens which is composed of lens elements which are isolated from each other. However, the micro fly-eye has the same structure as the fly-eye lens with regard to the point that the lens elements which have positive refractive power are arranged along the crosswise directions. In FIG. 1, number of the minute lenses which constitutes the micro fly-eye 3 are much decreased in comparison with the actual number thereof in order to simplify the figure.

The light beam which has entered into the micro fly-eye 3 is divided in two dimensions by a large number of minute lenses, and one light source (condensing point) is formed on a rear focal plane of each minute lens. The light beam emitted from a large number of light sources which are formed on the rear focal planes of the minute lenses enters into a diffraction optical element (DOE) 5 for forming a ring shaped illumination through an afocal lens 4.

The afocal lens 4 is constructed so as to enable to change magnification thereof continuously in a predetermined range with maintaining characteristics of an afocal system (non focal optical system). Furthermore, the afocal lens 4 optically conjugates the rear focal planes of the micro fly-eye 3 and a diffraction surface of the diffraction optical element 5, and a numerical aperture of the light beam which is condensed on a point of the diffraction surface of the diffraction optical element 5 changes depend on the magnification of the afocal lens 4.

In general, the diffraction optical element is constructed by forming corrugation which have pitches corresponding to a wavelength of the exposure light (illumination light) on a glass substrate, and diffracts the emitted light beam to a desired angle. Specifically, the diffraction optical element 5 for performing the ring shaped illumination converts the emitted light beam which has rectangular cross section into a light beam which has a ring shaped cross section. The light beam which passed through the diffraction optical element 5 enters into a fly-eye lens 7 which functions as an optical integrator through a zoom lens 6.

Here, position of an entrance surface of the fly eye lens 7 is determined in the vicinity of the rear focal plane of the zoom lens 6. Therefore, the light beam which passed through the diffraction optical element 5 forms a ring shaped illumination field which has a center on the optical axis AX onto the rear focal plane of the zoom lens 6 and onto the entrance surface of the fly eye lens 7. The size of this ring shaped illumination field changes depending on the focal length of the zoom lens 6. Consequently, the zoom lens 6 substantially connects the diffraction optical element 5 and the entrance surface of the fly eye lens 7 in a Fourier transformation relationship.

The fly-eye lens 7 is composed of a large number of lens elements which have positive refractive power and are closely arranged along crosswise directions. Furthermore, each lens element of the fly-eye lens 7 has a rectangular cross section which is similar to a shape of the illumination field which should be formed onto the mask (and a shape of an exposure area which should be formed onto the wafer). In addition, each entrance side surface of the lens elements which constitute the fly-eye lens 7 has a spherical face which projects toward the entrance side and each emitting side surface of the lens elements which constitute the fly-eye lens 7 has a spherical face which projects toward the emitting side.

The light beam which has entered into the fly-eye lens 7 is two-dimensionally separated by a large number of lens elements, and a large number of light sources are formed on a rear focal plane of each lens element in which the light beam has entered. As a result, a ring shaped plane light source (hereinafter called a "secondary light source") having a light-intensity distribution which is similar to that of the illumination field which is formed by the light beam which has entered into the fly-eye lens 7 is formed on the rear focal plane of the fly-eye lens 7. The light beam emitted from the ring shaped secondary light source which is formed on the rear focal plane of the fly-eye lens 7 enters into an aperture stop 8 which is provided in the vicinity of the fly-eye lens.

The light beam from the secondary light source which has passed through the aperture stop 8 which has a ring shaped opening (light transmission portion) is condensed by a condenser optical system 9, and then superimposes a rear focal plane thereof. As a result, a rectangular shaped illumination field which is similar to a shape of each lens element which constitutes the fly-eye lens 7 is formed on the rear focal plane of the condenser optical system 9. As described above, the micro-fly eye 3 through the condenser optical system 9 constitute an illumination field forming member for forming the illumination field on the predetermined plane (the rear focal plane of the condenser optical system 9) based on the light beam from the light source 1.

A mask blind 10 which functions as an illumination field stop is provided on the predetermined plane in which the rectangular illumination field is formed. The light source which has passed through a rectangular shaped opening (light transmission portion) of the mask blind 10 is condensed by a relay imaging optical system 11, and then superimposes the mask M in which a predetermined pattern is formed thereon. As a result, the relay imaging optical system 11 forms the images of the opening of the mask blind 10 onto the mask M. The details of the relay imaging optical system 11 will be explained with references to the following four embodiments.

The light beam which has passed through the pattern of the mask M forms an image of the pattern on the wafer W which is used as the photosensitive substrate through the projection optical system PL. Furthermore, the pattern of the mask M is sequentially exposed onto each exposure area of the wafer W by performing a static exposure or a scanning exposure while two-dimensionally controlling the movement of the wafer W in a plane (X-Y plane) which is perpendicular to the optical axis AX of the projection optical system PL.

Here, in the case of static exposure, the pattern of the mask is collectively exposed onto each exposure area of the wafer in accordance with a step and repeat method. In this case, the illumination area on the mask M has a rectangular shape which is close to a square, and a cross section of each lens element of the fly-eye lens 7 also has a rectangular shape which is close to the square. In contrast, in the case of the scan exposure, the pattern of the mask is scanned and exposed onto each exposure area of the wafer by relatively moving the mask and wafer toward the projection optical system PL in accordance with a step and scan method. In this case, the illumination area on the mask M has a rectangular shape in which the ratio between its short side and long side is 1:3, for example, and a cross section of each lens element of the fly-eye lens 7 also has a rectangular shape which is similar to this.

Furthermore, in this embodiment, an outer diameter (size) and a ratio between the outer diameter and an inner diameter (shape) of the ring shaped secondary light source can be simultaneously changed by changing the magnification of the afocal zoom lens 4. In addition, the outer diameter of the ring shaped secondary light source can be changed without changing the ratio between the outer diameter and the inner diameter thereof by changing the focal length of the zoom lens 6. As a result, the ratio between the outer diameter and the inner diameter of the ring shaped secondary light source can be changed without changing the outer diameter thereof by properly changing the magnification of the afocal zoom lens 4 and the focal length of the zoom lens 6.

Furthermore, in this embodiment, variant illuminations such as a four-poled illumination or an eight-poled illumination for example can be performed by changing the diffraction optical element 5 for the ring shaped illumination to a diffraction optical element for the four-poled illumination or the eight-poled illumination. In this case, the aperture stop 8 for the ring shaped illumination must be changed to an aperture stop for the four-poled illumination or the eight-poled illumination in accordance with the changing of the diffraction optical element 5. In addition, by changing the diffraction optical element 5 for the ring shaped illumination to an ordinary diffraction optical element for a circular illumination while removing the micro fly-eye 3 from an optical path, the ordinary circular illumination can be performed. In this case, the aperture stop 8 for the ring shaped illumination must be changed to an aperture stop for the circular illumination in accordance with the changing of the diffraction optical element 5.

First Embodiment

Figure 2:
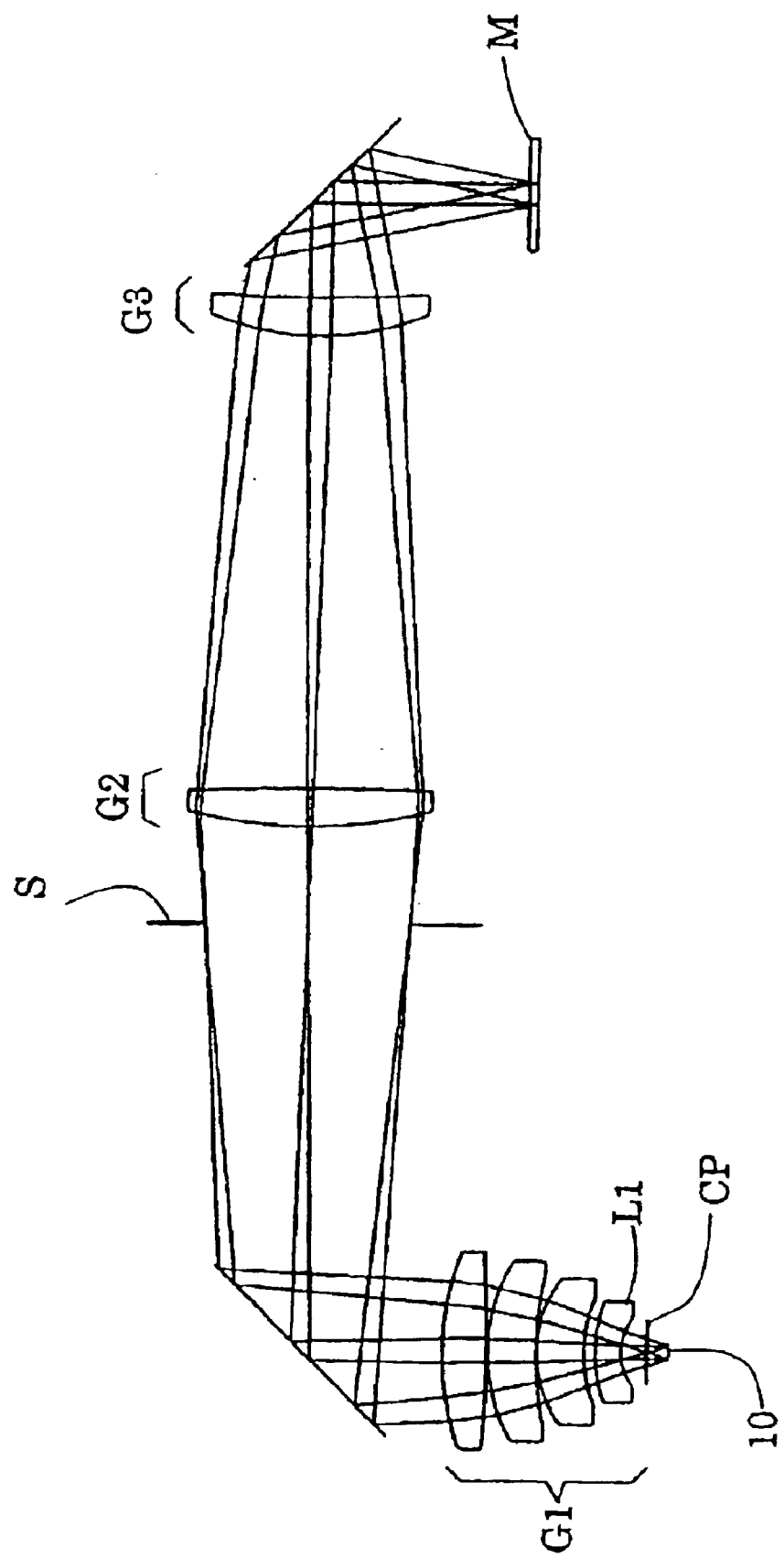
FIG. 2 is a drawing showing a composition of lenses of a relay imaging optical system concerning a first embodiment of the present invention.
Figure 3:
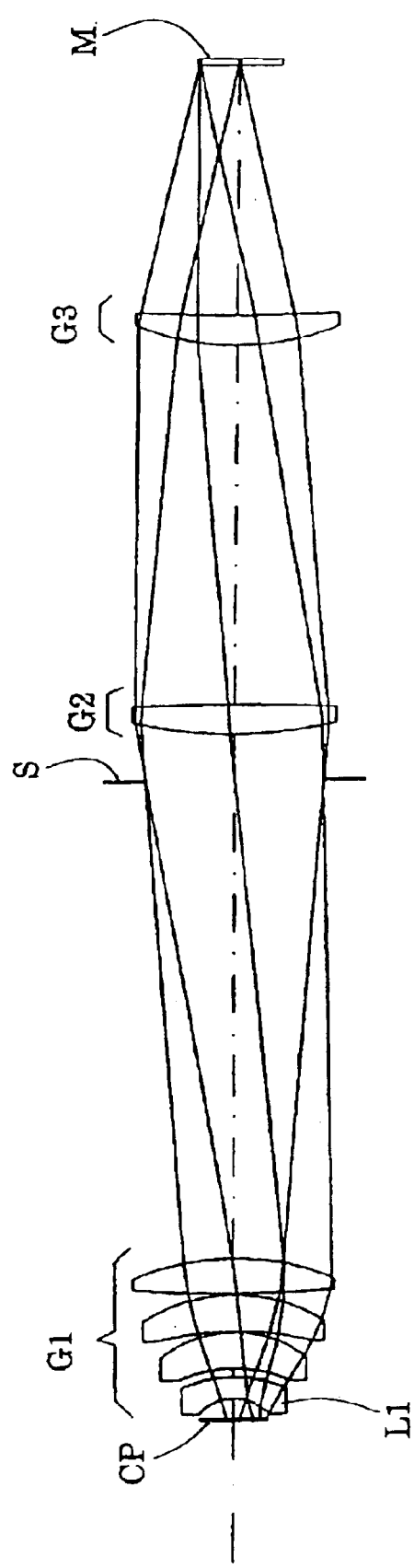
FIG. 3 is a drawing showing the relay imaging optical system concerning the first embodiment of the present invention which is extended along a straight optical axis.

FIG. 2 is a drawing showing a composition of lenses of a relay imaging optical system concerning a first embodiment of the present invention, and FIG. 3 is a drawing showing the relay imaging optical system concerning the first embodiment of the present invention which is extended along a straight optical axis.

The relay imaging optical system of the first embodiment is composed of a cover glass (parallel plate) CP, a first lens group G1, an aperture stop S, a second lens group G2, and a third lens group G3, from an object side (the mask blind 10 side).

The first lens group G1 is composed of a negative meniscus lens L1 which has a concave surface which faces the object side and an aspheric surface which faces an image side, a positive meniscus lens which has a concave surface which faces the object side, a positive meniscus lens which has a concave surface which faces the object side, and a biconvex lens, from the object side. The second lens group G2 is composed of a biconvex lens which has an aspheric surface which faces the image side. Furthermore, the third lens group G3 is composed of a positive meniscus lens which has an aspheric convex surface which faces the object side. In addition, the above six lenses, the cover glass CP, and the mask M which constitute the relay imaging optical system of the first embodiment are entirely made of quartz.

In every embodiment, the aspheric surface is expressed by the following expression (a) when its height along a direction perpendicular to the optical axis is designated as y, the distance between a contact plane on a vertex of the aspheric surface and a point on the aspheric surface at the height y along the optical axis (sag amount) is designated as x, radius of curvature of the vertex is designated as r, cone coefficient is designated as K, and a n-ordered aspheric coefficient is designated as Cn.

$$x=(y^2/r)/(1+(1-(1+\kappa)\cdot y^2/r^2)^{1/2})+C_4\cdot y^4+C_6\cdot y^6+C_8\cdot y^8+C_{10}\cdot y^{10}+C_{12}\cdot y^{12} \quad (a)$$

Furthermore, in every embodiment, the surface of the lens which forms aspheric surface is marked with an asterisk (*)

The data concerning the relay imaging optical system of the first embodiment are shown in the following Table 1. In Table 1, β denotes imaging magnification of the relay imaging optical system, β2 denotes magnification of the second lens group G2, and f denotes focal length of the first lens group G1. Furthermore, "Surface Number" denotes an order of the surface along a traveling direction of the light, r denotes radius of curvature of each surface (radius of curvature of the vertex in case of the aspheric surface: mm), and d denotes an axial space, that is, space (mm) between each surface.

TABLE 1

(Primary Data)

β = 0.5
β2 = 1.5382

(Data of Optical Parts)

| Surface Number | r | d | |
|---|---|---|---|
|  | (object surface) | 25.000000 | (mask blind 10) |
| 1 | ∞ | 3.000000 | (cover glass CP) |
| 2 | ∞ | 29.375557 |  |
| 3 | −63.87177 | 31.110200 | (first lens group G1: lens L1) |
| 4* | −160.61224 | 12.657986 |  |
| 5 | −175.00000 | 55.000000 |  |
| 6 | −152.07942 | 1.000000 |  |
| 7 | −430.32581 | 55.000000 |  |
| 8 | −222.28946 | 2.000000 |  |
| 9 | 1712.61401 | 51.000000 |  |
| 10 | −350.00000 | 801.571030 |  |
| 11 | 550.00000 | 46.000000 | (second lens group G2) |
| 12* | −2983.73036 | 282.830771 |  |
| 13 | ∞ | 262.454464 | (aperture stop S) |
| 14* | 317.73900 | 47.000000 | (third lens group G3) |
| 15 | 2257.23160 | 365.000000 |  |
| 16 | ∞ | 10.000000 | (mask M) |
| 17 | (image surface) |  |  |

(Aspheric Data)

Fourth Surface r = −160.61224
κ = 0
$C_4 = 0.270927 \times 10^{-7}$
$C_6 = 0.443278 \times 10^{-11}$
$C_8 = -0.343354 \times 10^{-15}$
$C_{10} = 0.346932 \times 10^{-19}$ Twelfth Surface r = −2983.73036
κ = 0
$C_4 = 0.143095 \times 10^{-8}$
$C_6 = -0.339535 \times 10^{-14}$
$C_8 = 0.271042 \times 10^{-18}$
$C_{10} = -0.784960 \times 10^{-23}$ Fourteenth Surface r = 317.73900
κ = 0
$C_4 = -0.247493 \times 10^{-8}$
$C_6 = -0.307173 \times 10^{-13}$
$C_8 = 0.375792 \times 10^{-18}$
$C_{10} -0.164443 \times 10^{-22}$ (Value Corresponding to Conditional Expression)

f1 = 373.660 mm
R1 = −63.872 mm
(1) | f1/R1 | = 5.850

Second Embodiment

Figure 4:
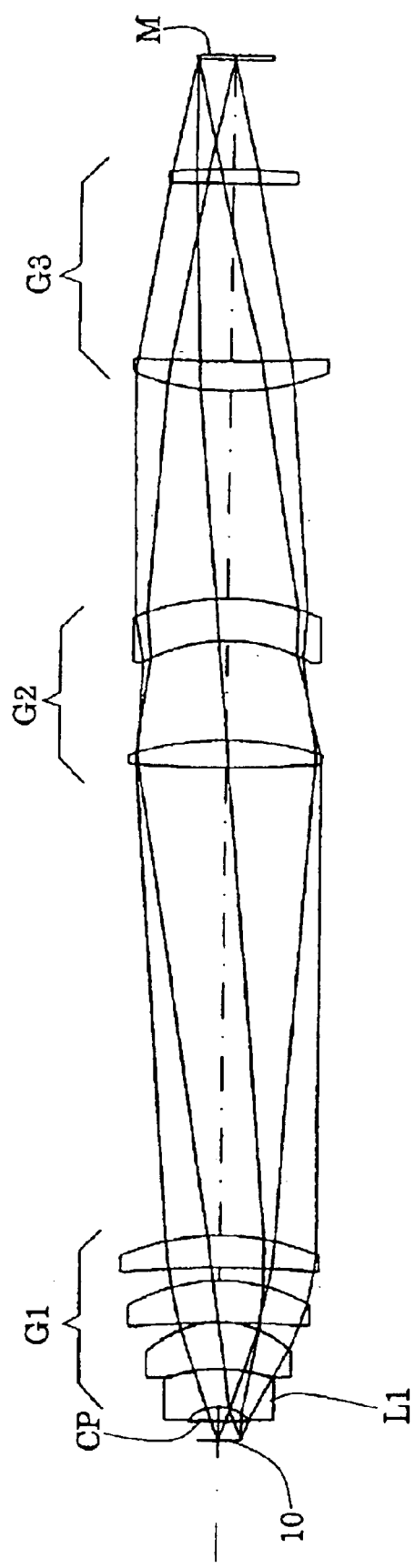
FIG. 4 is a drawing showing the relay imaging optical system concerning a second embodiment of the present invention which is extended along a straight optical axis.

FIG. 4 is a drawing showing the relay imaging optical system concerning the second embodiment of the present invention which is extended along a straight optical axis.

The relay imaging optical system of the second embodiment is composed of a cover glass CP, a first lens group G1, a second lens group G2, and a third lens group G3, from an object side (the mask blind 10 side). The aperture stop S is omitted in FIG. 4; however, the aperture stop S can be provided in the second lens group G2.

The first lens group G1 is composed of a negative meniscus lens L1 which has a concave surface which faces the object side and an aspheric surface which faces an image side, a positive meniscus lens which has a concave surface which faces the object side, a positive meniscus lens which has a concave surface which faces the object side, and a positive meniscus lens which has a concave surface which faces the object side, from the object side. The second lens group G2 is composed of a biconvex lens and a negative meniscus lens which has an aspheric concaved surface which faces the object side, from the object side. Furthermore, the third lens group G3 is composed of a positive meniscus lens has a concave surface which faces the object side and a planoconvex lens which has an aspheric convex surface which faces the image side, from the object side. In addition, the above eight lenses, the cover glass CP, and the mask M which constitute the relay imaging optical system of the second embodiment are entirely made of quartz.

The data concerning the relay imaging optical system of the second embodiment are shown in the following Table 2. In Table 2, β denotes imaging magnification of the relay imaging optical system, β2 denotes magnification of the second lens group G2, and f denotes focal length of the first lens group G1. Furthermore, "Surface Number" denotes an order of the surface along a traveling direction of the light, r denotes radius of curvature of each surface (radius of curvature of the vertex in case of the aspheric surface: mm), and d denotes an axial space, that is, space (mm) between each surface.

TABLE 2

(Primary Data)

β = 1.65
β2 = 0.9685

(Data of Optical Parts)

| Surface Number | r | d | |
|---|---|---|---|
|  | (object surface) | 29.000000 | (mask blind 10) |
| 1 | ∞ | 3.000000 | (cover glass CP) |
| 2 | ∞ | 21.114186 |  |
| 3 | −59.96455 | 55.894461 | (first lens group G1: lens L1) |
| 4* | −200.00000 | 0.100000 |  |
| 5 | −271.69694 | 72.376371 |  |
| 6 | −162.27854 | 0.100000 |  |
| 7 | −1660.39217 | 68.798551 |  |
| 8 | −260.00000 | 20.000000 |  |
| 9 | −1834.57325 | 50.000000 |  |
| 10 | −372.31842 | 749.248818 |  |
| 11 | 1769.86775 | 43.951905 | (second lens group G2) |
| 12 | −456.85638 | 161.545765 |  |
| 13* | −257.43460 | 67.144322 |  |
| 14 | −335.18262 | 329.920123 |  |
| 15 | 375.00000 | 47.091327 | (third lens group G3) |
| 16 | 2334.56712 | 280.000000 |  |
| 17 | ∞ | 24.068901 |  |

TABLE 2-continued

| | | |
|---|---|---|
| 18* | −847.61554 | 170.000000 |
| 19 | ∞ | 6.645109 (mask M) |
| 20 | (image surface) | |

(Aspheric Data)

Fourth Surface r = −200.00000
κ = 0
$C_4 = 0.445803 \times 10^{-7}$
$C_6 = 0.117442 \times 10^{-11}$
$C_8 = 0.111309 \times 10^{-15}$
$C_{10} = -0.908996 \times 10^{-20}$ Thirteenth Surface r = −257.43460
κ = 0
$C_4 = -0.536867 \times 10^{-9}$
$C_6 = -0.961133 \times 10^{-14}$
$C_8 = 0.290287 \times 10^{-17}$
$C_{10} = -0.757484 \times 10^{-22}$ Eighteenth Surface r = −847.61554
κ = 0
$C_4 = 0.682176 \times 10^{-8}$
$C_6 = -0.199473 \times 10^{-12}$
$C_8 = 0.611477 \times 10^{-16}$
$C_{10} = -0.297951 \times 10^{-20}$ (Value Corresponding to Conditional Expression)

f1 = 379.838 mm
R1 = −59.96455 mm
(1) | f1/R1 | = 6.334

Third Embodiment

Figure 5:
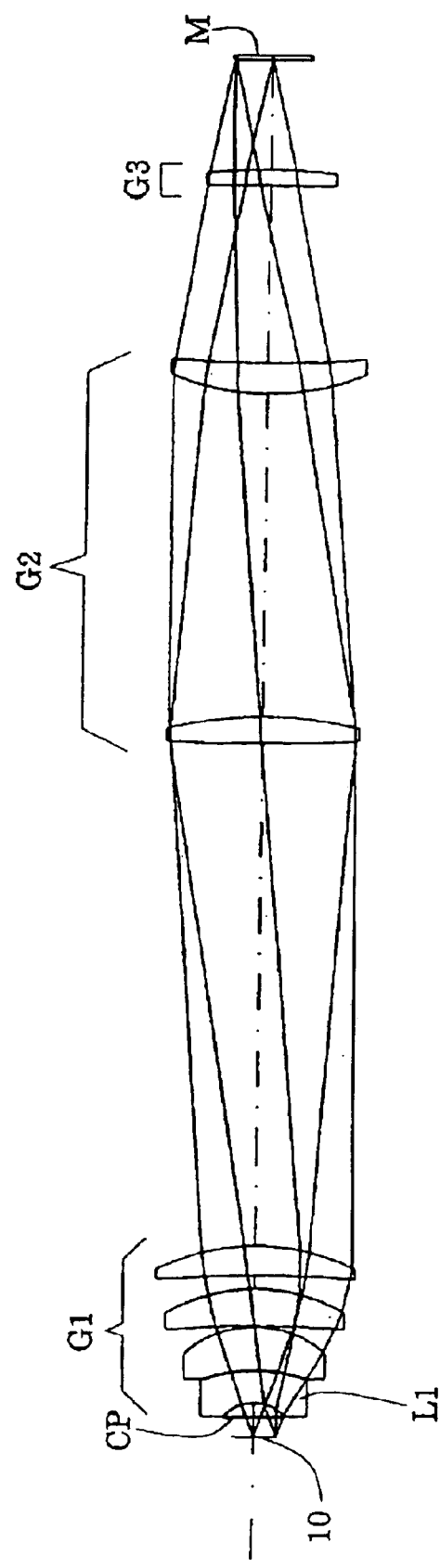
FIG. 5 is a drawing showing the relay imaging optical system concerning a third embodiment of the present invention which is extended along a straight optical axis.

FIG. 5 is a drawing showing the relay imaging optical system concerning the third embodiment of the present invention which is extended along a straight optical axis.

The relay imaging optical system of the third embodiment is composed of a cover glass CP, a first lens group G1, a second lens group G2, and a third lens group G3, from an object side (the mask blind 10 side). The aperture stop S is omitted in FIG. 5; however, the aperture stop S can be provided in the vicinity of the second lens group G2 from the object side.

The first lens group G1 is composed of a negative meniscus lens L1 which has a concave surface which faces the object side and an aspheric surface which faces an image side, a positive meniscus lens which has a concave surface which faces the object side, a positive meniscus lens which has a concave surface which faces the object side, and a positive meniscus lens which has a concave surface which faces the object side, from the object side. The second lens group G2 is composed of a biconvex lens which has an aspheric surface which faces the image side and a positive meniscus lens which has a convex surface which faces the object side, from the object side. Furthermore, the third lens group G3 is composed of a planoconvex lens which has an aspheric convex surface which faces the image side. In addition, the above seven lenses, the cover glass CP, and the mask M which constitute the relay imaging optical system of the third embodiment are entirely made of quartz.

The data concerning the relay imaging optical system of the third embodiment are shown in the following Table 3. In Table 3, β denotes imaging magnification of the relay imaging optical system, β2 denotes magnification of the second lens group G2, and f denotes focal length of the first lens group G1. Furthermore, "Surface Number" denotes an order of the surface along a traveling direction of the light, r denotes radius of curvature of each surface (radius of curvature of the vertex in case of the aspheric surface: mm), and d denotes an axial space, that is, space (mm) between each surface.

TABLE 3

(Primary Data)

β = 1.65
β2 = 0.3848
(Data of Optical Parts)

| Surface Number | r | d | |
|---|---|---|---|
| | (object surface) | 29.000000 | (mask blind 10) |
| 1 | ∞ | 3.000000 | (cover glass CP) |
| 2 | ∞ | 21.124917 | |
| 3 | −59.94330 | 50.810073 | (first lens group G1: lens L1) |
| 4* | −200.00000 | 1.856500 | |
| 5 | −219.38541 | 65.295175 | |
| 6 | −157.05786 | 2.026166 | |
| 7 | −1400.00000 | 59.425234 | |
| 8 | −260.00000 | 20.000000 | |
| 9 | −2500.00000 | 50.000000 | |
| 10 | −307.27793 | 806.350295 | |
| 11 | 2731.17878 | 43.951905 | (second lens group G2) |
| 12* | −563.58811 | 519.354282 | |
| 13 | 375.00000 | 47.091327 | |
| 14 | 1738.57272 | 280.000000 | |
| 15 | ∞ | 24.068901 | (third lens group G3) |
| 16* | −862.97805 | 170.000000 | |
| 17 | ∞ | 6.645109 | (mask M) |
| 18 | (image surface) | | |

(Aspheric Data)

Fourth Surface r = −200.00000
κ = 0
$C_4 = 0.473802 \times 10^{-7}$
$C_6 = 0.295460 \times 10^{-11}$
$C_8 = -0.116621 \times 10^{-15}$
$C_{10} = 0.434687 \times 10^{-21}$ Twelfth Surface r = −563.58811
κ = 0
$C_4 = 0.143890 \times 10^{-8}$
$C_6 = 0.283663 \times 10^{-13}$
$C_8 = -0.180112 \times 10^{-17}$
$C_{10} = 0.452456 \times 10^{-22}$
$C_{12} = -0.171360 \times 10^{-27}$ Sixteenth Surface r = −862.97805
κ = 0
$C_4 = 0.524949 \times 10^{-8}$
$C_6 = 0.169937 \times 10^{-12}$
$C_8 = -0.163315 \times 10^{-17}$
$C_{10} = 0.555397 \times 10^{-23}$ (Value Corresponding to Conditional Expression)

f1 = 385.036 mm
R1 = −59.9433 mm
(1) | f1/R1 | = 6.423

Fourth Embodiment

Figure 6:
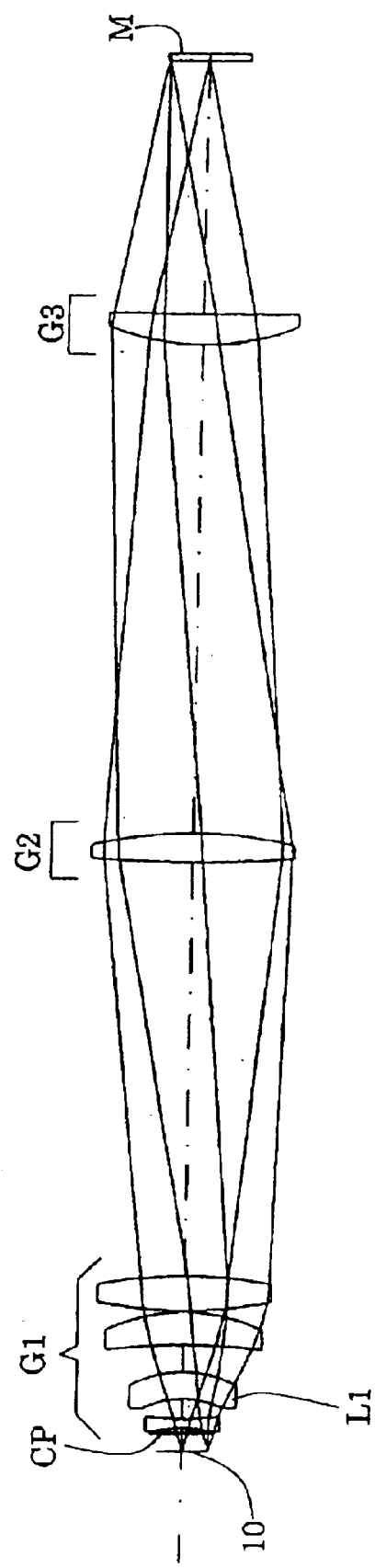
FIG. 6 is a drawing showing the relay imaging optical system concerning a fourth embodiment of the present invention which is extended along a straight optical axis.

FIG. 6 is a drawing showing the relay imaging optical system concerning the fourth embodiment of the present invention which is extended along a straight optical axis.

The relay imaging optical system of the fourth embodiment is composed of a cover glass CP, a first lens group G1, a second lens group G2, and a third lens group G3, from an object side (the mask blind 10 side). The aperture stop S is omitted in FIG. 6; however, the aperture stop S can be provided in an optical path between the second lens group G2 and third lens group G3.

The first lens group G1 is composed of a biconcave lens which has an aspheric surface which faces an image side, a negative meniscus lens L1 which has a concave surface which faces the object side and an aspheric surface which faces the image side, a positive meniscus lens which has a concave surface which faces the object side, and a biconvex lens, from the object side. The second lens group G2 is composed of a biconvex lens which has an aspheric surface which faces the image side. Furthermore, the third lens group G3 is composed of a positive meniscus lens which has a convex surface which faces the object side. In addition, the above six lenses, the cover glass CP, and the mask M which constitute the relay imaging optical system of the fourth embodiment are entirely made of quartz.

The data concerning the relay imaging optical system of the fourth embodiment are shown in the following Table 4. In Table 4, β denotes imaging magnification of the relay imaging optical system, β2 denotes magnification of the second lens group G2, and f denotes focal length of the first lens group G1. Furthermore, "Surface Number" denotes an order of the surface along a traveling direction of the light, r denotes radius of curvature of each surface (radius of curvature of the vertex in case of the aspheric surface: mm), and d denotes an axial space, that is, space (mm) between each surface.

TABLE 4

(Primary Data)

β = 1.5
β2 = 1.536
(Data of Optical Parts)

| Surface Number | r | d | |
|---|---|---|---|
| | (object surface) | 24.000000 | (mask blind 10) |
| 1 | ∞ | 3.000000 | (cover glass CP) |
| 2 | ∞ | 5.312634 | |
| 3 | −236.97636 | 13.000000 | (first lens group G1) |
| 4* | 230.60587 | 28.427249 | |
| 5 | −128.33718 | 41.000000 | (meniscus lens L1) |
| 6 | −144.30322 | 38.671058 | |
| 7 | −835.56243 | 49.000000 | |
| 8 | −244.65574 | 2.000000 | |
| 9 | 600.00000 | 50.000000 | |
| 10 | −655.08071 | 622.894601 | |
| 11 | 1612.55882 | 46.000000 | (second lens group G2) |
| 12* | −549.24551 | 734.694480 | |
| 13 | 335.88422 | 47.000000 | (third lens group G3) |
| 14 | 7562.75817 | 365.000000 | |
| 15 | ∞ | 10.000000 | (mask M) |
| 16 | (image surface) | | |

(Aspheric Data)

Fourth Surface r = 230.60587
κ = 0
$C_4 = -0.321139 \times 10^{-6}$
$C_6 = 0.170568 \times 10^{-10}$
$C_8 = -0.575670 \times 10^{-14}$
$C_{10} = 0.360508 \times 10^{-18}$ Sixth Surface r = −144.30322
κ = 0
$C_4 = 0.165944 \times 10^{-7}$
$C_6 = -0.292836 \times 10^{-11}$ TABLE 4-continued $C_8 = 0.488715 \times 10^{-16}$
$C_{10} = 0.791354 \times 10^{-19}$ Twelfth Surface r = −549.24551
κ = 0
$C_4 = 0.230189 \times 10^{-8}$
$C_6 = -0.623765 \times 10^{-14}$
$C_8 = 0.525144 \times 10^{-18}$
$C_{10} = -0.114363 \times 10^{-22}$ (Value Corresponding to Conditional Expression)

f1 = 582.376 mm
R1 = −128.337 mm
(1) | f1/R1 | = 4.538

Figure 7:
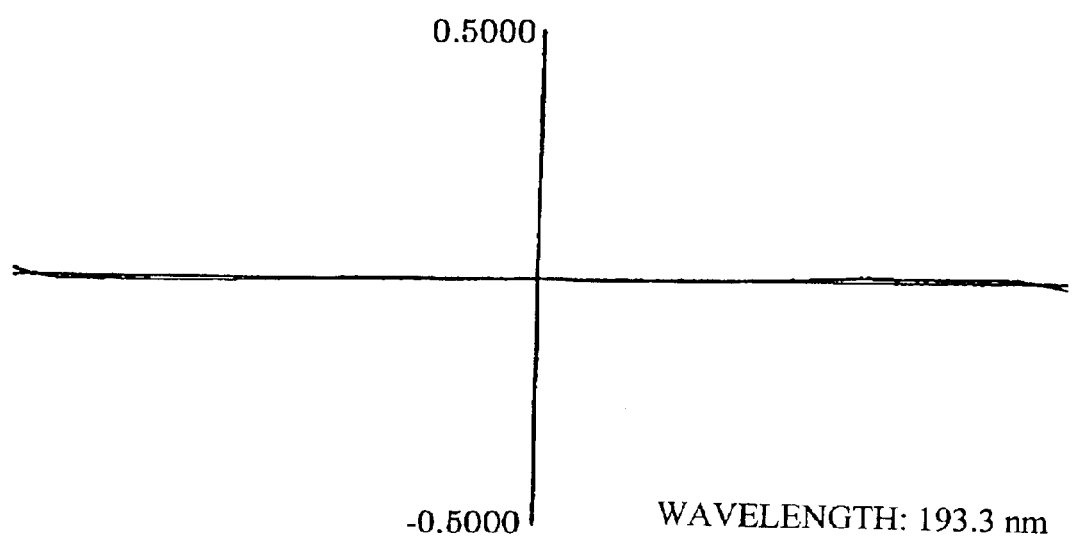
FIG. 7 is a drawing showing spherical aberration (expressed as lateral aberration) of the first embodiment of the present invention.

It was confirmed that required imaging characteristics (optical characteristics) are satisfied by each of the above-described embodiments. Spherical aberration (expressed as lateral aberration) of the first embodiment is shown in FIG. 7 as an example of the imaging characteristics which are satisfied by the embodiments. In each of the embodiments, since the imaging magnifications of the relay imaging optical system are three or fewer, the spherical aberration of the relay imaging optical system itself can easily be decreased. Furthermore, since the image plane of the first lens group is positioned within a limited range and the second lens group is magnifying, the degree of freedom of design of the system is increased and the maximum diameter of the lenses can be decreased. As described above, in each relay imaging optical system of the above embodiments, the system can be miniaturized and reduced in weight while maintaining required optical characteristics by constructing the system with a small number of lenses. Therefore, in the illumination optical apparatus and the exposure apparatus according to the above embodiments, effects of clouding on the surfaces of the lenses and of decrease of permeability of the lenses due to detrimental gases are reduced even when an ArF excimer laser is used as a light source. Furthermore, the exposure apparatus according to the above embodiments has the structure which is resistant to the effects of vibration, since the relay imaging optical system which is installed therein is miniaturized and is made light.

In the exposure apparatus according to the above embodiments, micro-devices (semiconductor elements, imaging elements, liquid crystal display elements, and thin film magnetic heads and the like) can be manufactured by illuminating the mask using the illumination optical apparatus (illumination step) and performing scanning exposure of the pattern to be transferred which is formed on the mask onto the photosensitive substrate using the projection optical system (exposure step). Next, an embodiment of a manufacturing method for semiconductor devices as the micro-devices by forming a predetermined circuit pattern onto the wafer which is used as the photosensitive substrate by the exposure apparatus of FIG. 1 will be explained with reference to the flowchart in FIG. 8.

Figure 8:
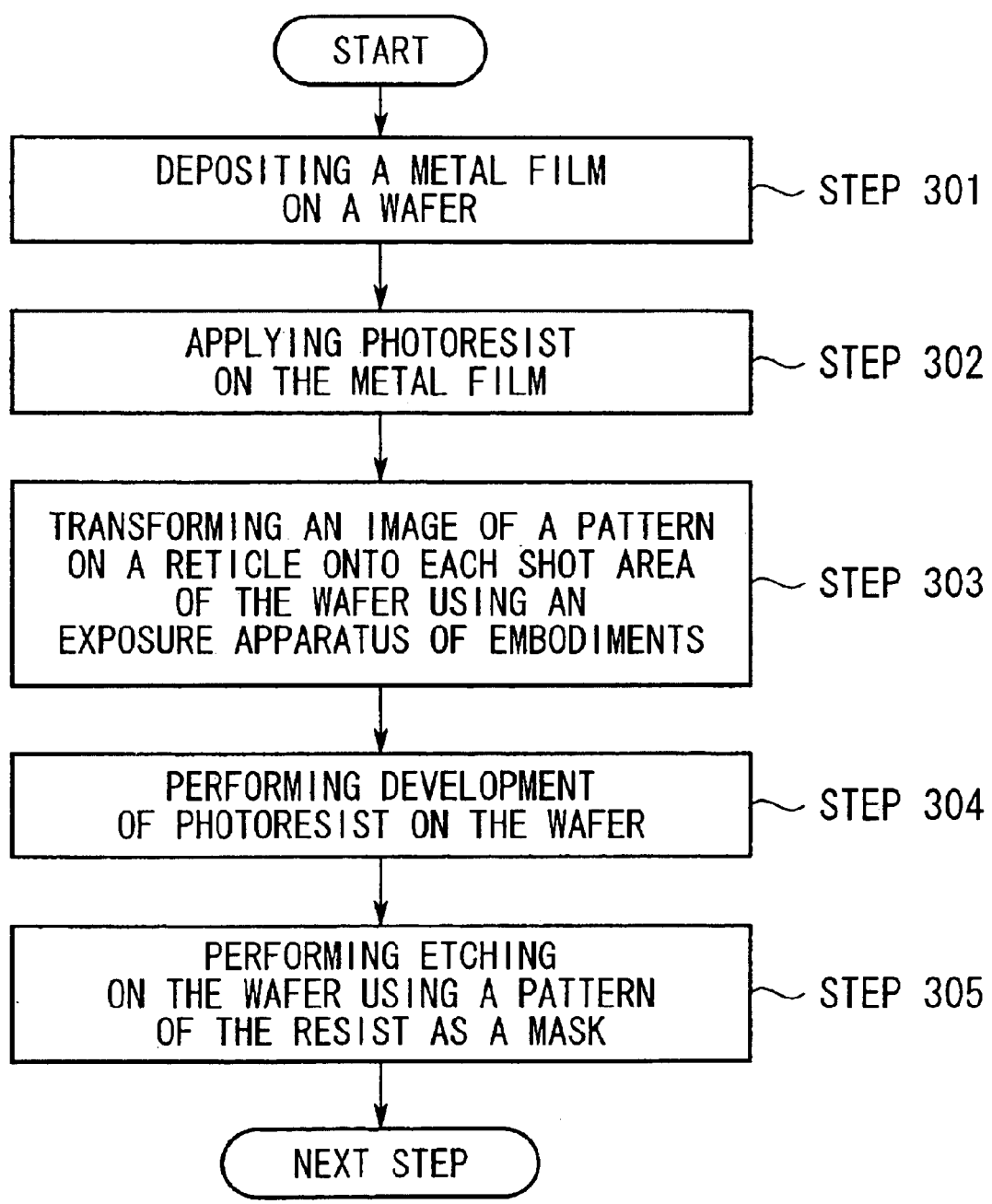
FIG. 8 is a flowchart showing a process for manufacturing semiconductor devices as micro-devices.

In FIG. 8, in step 301, a metal film is formed on the surfaces of one lot of wafers by deposition. In step 302, photoresist is applied on the metal film which was formed on the surfaces of the one lot of wafers. Subsequently, in step 303, by using the exposure apparatus according to the above embodiments, the pattern on the mask is successively exposed and transferred onto respective shot areas on the one lot of wafers through the projection optical system (projection optical module) of the apparatus. Furthermore, in step 304, the photoresist on the one lot of wafers are developed; and in step 305, the circuit pattern which is corresponding to the pattern on the mask is formed on each shot area of the wafers by performing etching in which each pattern of the resist on the one lot of wafers is used as the mask. Then, the semiconductor devices are manufactured by forming circuit patterns of upper layers onto the wafers. According to the above-described manufacturing method for the semiconductor device, the semiconductor devices which have extremely minute circuit patterns can be obtained with high throughput.

Furthermore, the liquid crystal display elements as the micro-devices can be obtained by forming a predetermined pattern (a circuit pattern or an electrode pattern) onto a plate (glass substrate) by using the exposure apparatus according to the above embodiments shown in FIG. 1. Next, an embodiment of a manufacturing method for this element will be explained with reference to the flowchart in FIG. 9.

Figure 9:
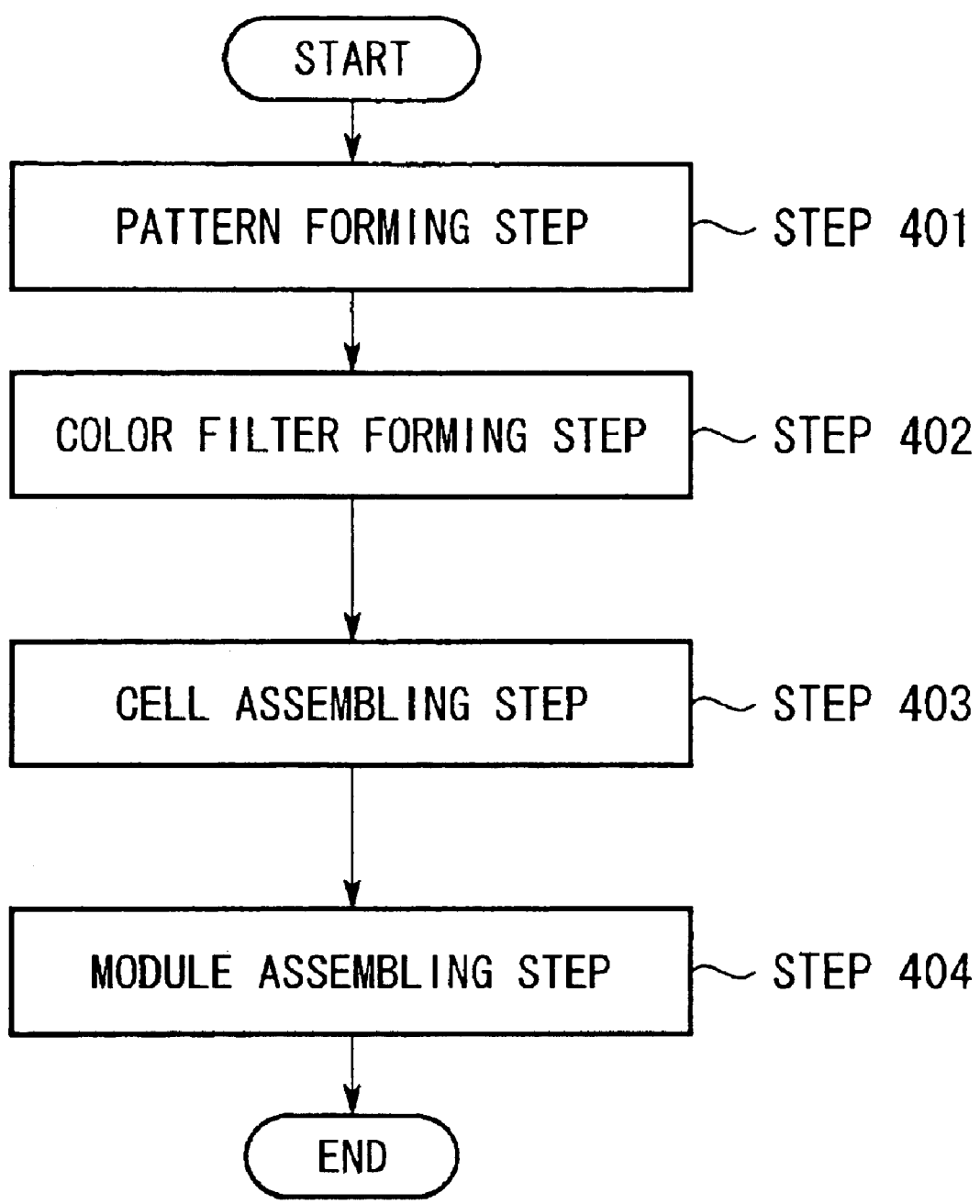
FIG. 9 is a flowchart showing a process for manufacturing liquid crystal displays as micro-devices.

In FIG. 9, in a pattern forming step 401, a process what is called a photolithography process is performed by using the exposure apparatus according to the above embodiments. In this step, a pattern on a mask is exposed and transferred onto a photosensitive substrate (the glass substrate in which a resist has been applied thereon and the like). According to the photolithography process, a predetermined pattern which includes numerous electrodes is formed onto the photosensitive substrate. Furthermore, by performing steps such as a development step, an etching step, and a reticle removal step and the like on the exposed substrate, the predetermined pattern is formed onto the substrate. Then, the following color filter forming step 402 is performed.

In the color filter forming process 402, a color filter which is provided by a large number of fabrics which are composed of cells corresponding to dots of R (Red), G (Green), and B (Blue), and are arranged so as to form a matrix; or by a large number of fabrics which are composed of three stripe shaped filters corresponding to the above R, G, and B, and are arranged along a direction of a scanning line, is formed.

Furthermore, a cell assemble process 403 is performed after the color filter forming process 402. In the cell assembling process-403, a liquid crystal panel (a liquid crystal cell) is assembled from the substrate having the predetermined pattern which was formed by the pattern forming step 401 and the color filter which was formed by the color filter forming process 402, and the like. In this cell assembling process 403, the liquid crystal panel (liquid crystal cell) is assembled by filling liquid crystal between the substrate having the predetermined pattern which was formed by the pattern forming step 401 and the color filter which was formed by the color filter forming process 402.

Then, in a module assembling step 404, the liquid crystal display element is manufactured by attaching other parts such as an electric circuit for performing display operation of the liquid crystal panel (liquid crystal cell) and a back panel to this panel. According to the above-described manufacturing method for the liquid crystal display element, liquid crystal display elements which have extremely minute circuit pattern can be obtained with high throughput.

In the above embodiments, the fly-eye lens 7 is used as a wavefront resolution type optical integrator; however, it is unnecessary to limit it to this, and a rod shaped internal reflection type optical integrator can also be used. The rod shaped optical integrator is an internal reflection type glass rod which is made of glass materials such as quartz glass or fluorite, and forms light source images corresponding to a number of internal reflections by utilizing total reflection which arises on an interface between its interior and exterior or an internal surface and passes through its condensing point. In this case, most of the light source images are virtual images; however, only the light source image which is provided at the center (condensing point) thereof is a real image. That is, a light beam which has entered into the rod shaped optical integrator is divided to directions according to its angle by means of internal reflection, and these divided light beams pass through the condensing point and form a secondary light source which is composed of a large number of light source images on a plane which is parallel to its entrance surface.

In the embodiment shown in FIG. 1, a first optical system is provided into an optical path between the zoom lens 6 and rod shaped optical integrator, and a second optical system is provided instead of the condenser optical system 9. Here, the first optical system optically conjugates an entrance pupil of the zoom lens 6 and an entrance surface of the rod shaped optical integrator, and optically conjugates a rear focal plane of the zoom lens 6 and an exit surface of the rod shaped optical integrator. Furthermore, the second optical system optically conjugates the exit surface the rod shaped optical integrator and the mask blind 10.

In the above embodiments, the present invention is applied to the relay imaging optical system which is installed in the illumination optical apparatus of the exposure optical system; however, the present invention is not limited to this, and of course a variety of examples can be applied in the scope of the present invention.

As explained above, in the relay imaging optical system of the present invention, the system can be miniaturized and reduced in weight while maintaining required optical characteristics by constructing the system with a small number of lenses. Therefore, in an illumination optical apparatus and the exposure apparatus having the relay imaging optical system of the present invention, effects of clouding on the surfaces of the lenses and of decrease of permeability of the lenses due to harmful gases are reduced even when an ArF excimer laser is used as a light source.

Furthermore, in the exposure apparatus having the relay imaging optical system of the present invention, the structure of the exposure apparatus becomes resistant to the effects of vibration as a result of the miniaturization and reduction in weight of the relay imaging optical system. Therefore, superior micro-devices can be manufactured with high accuracy by performing projection exposure using the exposure apparatus of the present invention under appropriate exposure conditions.

What is claimed is:

1. A relay imaging optical system which forms an image of a first plane on a second plane, the relay imaging optical system comprising:
    a pupil;
    a front lens group arranged in an optical path between the first plane and a position of the pupil; and
    a rear lens group arranged in an optical path between the position of the pupil and the second plane, the rear lens group including two aspheric surfaces which are formed on convex lens surfaces; wherein
    a total number of lenses which constitute the relay imaging optical system is ten or less.

2. A relay imaging optical system according to claim 1, wherein an aperture is arranged at the position of the pupil of the relay imaging optical system.

3. A relay imaging optical system according to claim 1, wherein the front lens group comprises a first lens group, and the rear lens group comprises a second lens group and a third lens group.

4. A relay imaging optical system according to claim 1, wherein the front lens group comprises an aspheric surface.

5. A relay imaging optical system according to claim 4, wherein the front lens group comprises a plurality of lenses, and a lens arranged closest to the first plane among the plurality of lenses in the first lens group has the aspheric surface.

6. A relay imaging optical system according to claim 5, wherein the lens arranged closest to the first plane among the plurality of lenses in the front lens group has a concave surface facing the first plane side.

7. A relay imaging optical system according to claim 6, wherein the lens arranged closest to the first plane among the plurality of lenses in the front lens group has the aspheric surface facing the second plane side.

8. A relay imaging optical system according to claim 5, wherein the lens arranged closest to the first plane among the plurality of lenses in the front lens group comprises a meniscus lens.

9. A relay imaging optical system according to claim 3, wherein the first lens group comprises a plurality of lenses, and comprises a meniscus lens arranged closest to the first plane among the plurality of lenses in the first lens group, and wherein the meniscus lens has an aspheric surface, and has a concave surface facing the first plane side.

10. A relay imaging optical system according to claim 8, wherein a conditional expression $0.1<|f1/R1|<10$ is satisfied when a radius of curvature of the concave surface facing the first plane side of the meniscus lens is designated as R1 and a focal length of the first lens group is designated as f1.

11. A relay imaging optical system according to claim 10, wherein the meniscus lens in the first lens group has the aspheric surface facing the second plane side.

12. A relay imaging optical system according to claim 3, wherein the first lens group comprises a plurality of lenses, and a lens arranged closest to the first plane among the plurality of lenses in the first lens group has an aspheric surface.

13. A relay imaging optical system according to claim 3, wherein the first lens group comprises a plurality of lenses, and a lens arranged closest to the first plane among the plurality of lenses in the first lens group has a concave surface facing the first plane side.

14. A relay imaging optical system according to claim 13, wherein a conditional expression $0<|f1/R1|<10$ is satisfied when a radius of curvature of the concave surface facing the first plane side of the lens arranged closest to the first plane in the first lens group is designated as R1 and a focal length of the first lens group is designated as f1.

15. A relay imaging optical system according to claim 14, wherein the lens arranged closest to the first plane in the first lens group has an aspheric surface facing the second plane side.

16. A relay imaging optical system according to claim 1, wherein one of the two aspheric surfaces in the rear lens group is formed on a lens arranged closest to the second plane.

17. A relay imaging optical system according to claim 1, wherein one of the two aspheric surfaces in the rear lens group is formed on a lens arranged closest to the pupil.

18. A relay imaging optical system according to claim 1, wherein the relay imaging optical system has an image magnification ratio of less than 3 times.

19. A relay imaging optical system which forms an image of a first plane on a second plane, the relay imaging optical system comprising:

a total number of lenses which is ten or less;

at least two aspheric surfaces; and wherein a lens arranged closest to the first plane among the ten or less lenses of the relay imaging optical system has one of the at least two aspheric surfaces.

20. A relay imaging optical system according to claim 19, wherein the aspheric lens arranged closest to the first plane among the ten or less lenses of the relay imaging optical system has a concave surface facing the first plane side.

21. A relay imaging optical system according to claim 19, wherein the lens having the aspheric surface arranged closest to the first plane among the ten or less lenses of the relay imaging optical system comprises a meniscus lens.

22. A relay imaging optical system according to claim 20, wherein the relay imaging optical system comprises, in order from the first plane side, a first lens group, a second lens group, and a third lens group, and a conditional expression $0.1<|f1/R1|<10$ is satisfied when a radius of curvature of the concave surface facing the first plane side of the lens arranged closest to the first plane in the first lens group is designated as R1 and a focal length of the first lens group is designated as f1.

23. A relay imaging optical system which forms an image of a first plane on a second plane, the relay imaging optical system comprising:

a pupil;

at least two aspheric surfaces; and a meniscus lens arranged in an optical path between the first plane and a position of the pupil, the meniscus lens has one of the at least two aspheric surfaces; wherein a total number of lenses which constitute the relay imaging optical system is ten or less.

24. An illumination apparatus which illuminates an irradiated plane, the illumination apparatus comprising:

an illumination field forming apparatus which forms an illumination field on a predetermined plane based on a light beam from a light source; and the relay imaging optical system according to claim 1 for forming an image of the illumination field formed on the predetermined plane onto the irradiated plane, wherein the predetermined plane corresponds to the first plane of the relay imaging optical system and the irradiated plane corresponds to the second plane of the relay imaging optical system.

25. An illumination apparatus according to claim 24, further comprising an optical integrator arranged in an optical path between the light source and the predetermined plane, the optical integrator comprising an optical element constituted by multiple micro lenses.

26. An exposure apparatus which exposes a pattern of a mask onto a photosensitive substrate, the exposure apparatus comprising:

the illumination apparatus according to claim 24, and a projection optical system for projecting the pattern of the mask which is provided on the irradiated plane onto the photosensitive substrate.

27. A manufacturing method for a micro-device, the method comprising:

exposing a pattern of a mask onto a photosensitive substrate by using the exposure apparatus according to claim 26, and developing the photosensitive substrate which was exposed in the exposing step.

28. An illumination apparatus which illuminates an irradiated plane, the illumination apparatus comprising:

an illumination field forming apparatus which forms an illumination field on a predetermined plane based on a light beam from a light source; and the relay imaging optical system according to claim 19 for forming an image of the illumination field formed on the predetermined plane onto the irradiated plane, wherein the predetermined plane corresponds to the first plane of the relay imaging optical system and the irradiated plane corresponds to the second plane of the relay imaging optical system.

29. An illumination apparatus according to claim 28, further comprising an optical integrator arranged in an optical path between the light source and the predetermined plane, the optical integrator comprising an optical element constituted by multiple microlenses.

30. An exposure apparatus which exposes a pattern of a mask onto a photosensitive substrate, the exposure apparatus comprising:

the illumination apparatus according to claim 28, and a projection optical system for projecting the pattern of the mask which is provided on the irradiated surface onto the photosensitive substrate.

31. A manufacturing method for a micro-device, the method comprising:

exposing a pattern of a mask onto a photosensitive substrate by using the exposure apparatus according to claim 30, and developing the photosensitive substrate which was exposed in the exposing step.

32. An illumination apparatus which illuminates an irradiated plane, the illumination apparatus comprising:

an illumination field forming apparatus which forms an illumination field on a predetermined plane based on a light beam from a light source; and the relay imaging optical system according to claim 23 for forming an image of the illumination field formed on the predetermined plane onto the irradiated plane, wherein the predetermined plane corresponds to the first plane of the relay imaging optical system and the irradiated plane corresponds to the second plane of the relay imaging optical system.

33. An illumination apparatus according to claim 32, further comprising an optical integrator arranged in an optical path between the light source and the predetermined plane, the optical integrator comprising an optical element constituted by multiple microlenses.

34. An exposure apparatus which exposes a pattern of a mask onto a photosensitive substrate, the exposure apparatus comprising:

the illumination apparatus according to claim 32, and a projection optical system for projecting the pattern of the mask provided on the irradiated surface onto the photosensitive substrate.

35. A manufacturing method for a micro-device, the method comprising:

exposing a pattern of a mask onto a photosensitive substrate by using the exposure apparatus according to claim 34, and developing the photosensitive substrate which was exposed in the exposing step.

\* \* \* \* \*